United States Patent [19]

Yerman et al.

[11] Patent Number: 4,646,129

[45] Date of Patent: Feb. 24, 1987

[54] HERMETIC POWER CHIP PACKAGES

[75] Inventors: Alexander J. Yerman, Scotia; Constantine A. Neugebauer, Schenectady, both of N.Y.

[73] Assignee: General Electric Company, Schenectady, N.Y.

[21] Appl. No.: 872,792

[22] Filed: Jun. 11, 1986

Related U.S. Application Data

[63] Continuation of Ser. No. 529,295, Sep. 6, 1983, abandoned.

[51] Int. Cl.⁴ .................... H01L 23/12; H01L 23/02; H01L 23/08; H01L 23/10
[52] U.S. Cl. ........................................ 357/74; 357/81; 357/80
[58] Field of Search ............................ 357/74, 80, 81; 174/16 HS, 52 FP

[56] References Cited

U.S. PATENT DOCUMENTS

| | | | |
|---|---|---|---|
| 3,769,560 | 10/1973 | Miyake et al. | 357/74 |
| 3,972,062 | 7/1976 | Hopp | 357/74 |
| 4,221,047 | 9/1980 | Narken et al. | 357/80 |
| 4,264,917 | 4/1981 | Ugon | 357/80 |
| 4,338,621 | 7/1982 | Braun | 357/81 |
| 4,538,170 | 8/1985 | Yerman | 357/80 |

Primary Examiner—Andrew J. James
Assistant Examiner—S. J. Clark
Attorney, Agent, or Firm—Paul R. Webb, II; James C. Davis, Jr.

[57] ABSTRACT

Hermetic power chip packages are constructed in building block form to reduce the cost of electrical testing of power chips. The power chip packages utilized dielectric plates with metallic sheets bonded to the dielectric plates. Electric access to at least selected terminals of a power chip is gained through one of the dielectric plates by including holes through the plates which are filled with a conductive medium. One form of the hermetic package includes a gasket with a thermal expansion coefficient close to that of a dielectric plate of the hermetic package and thereby results in a high level of package durability even after repeated cycling of the package between widely differing hot and cold temperatures.

11 Claims, 8 Drawing Figures

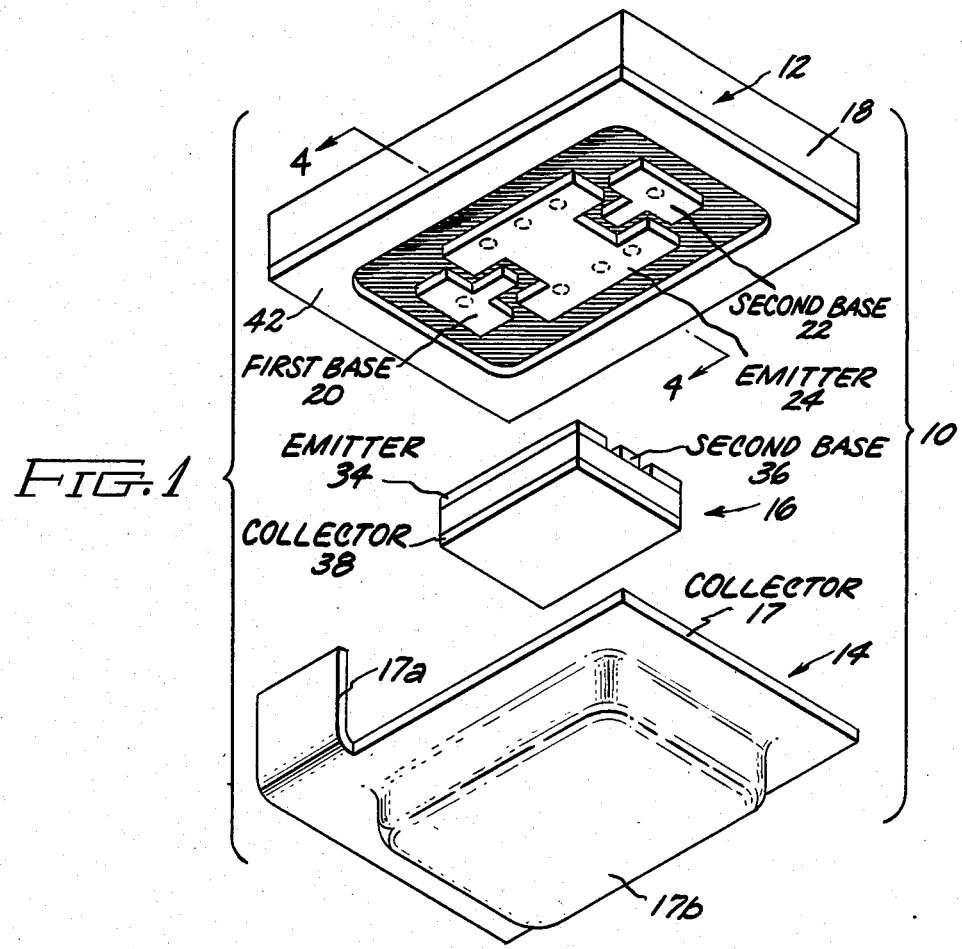
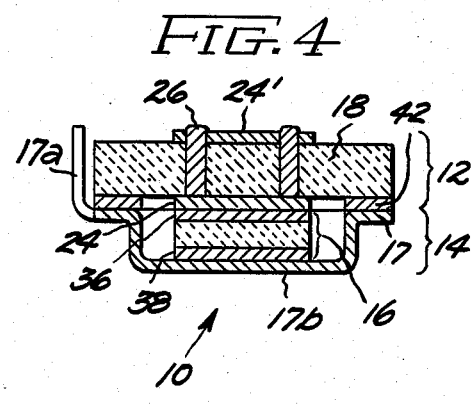
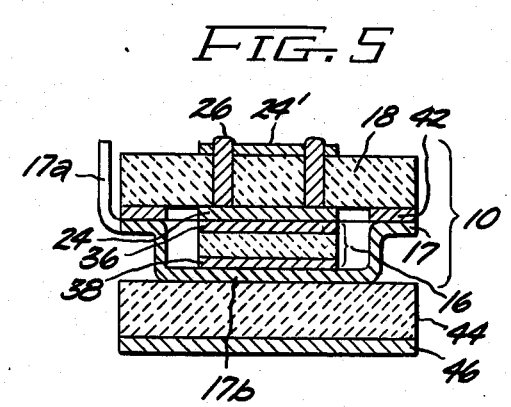

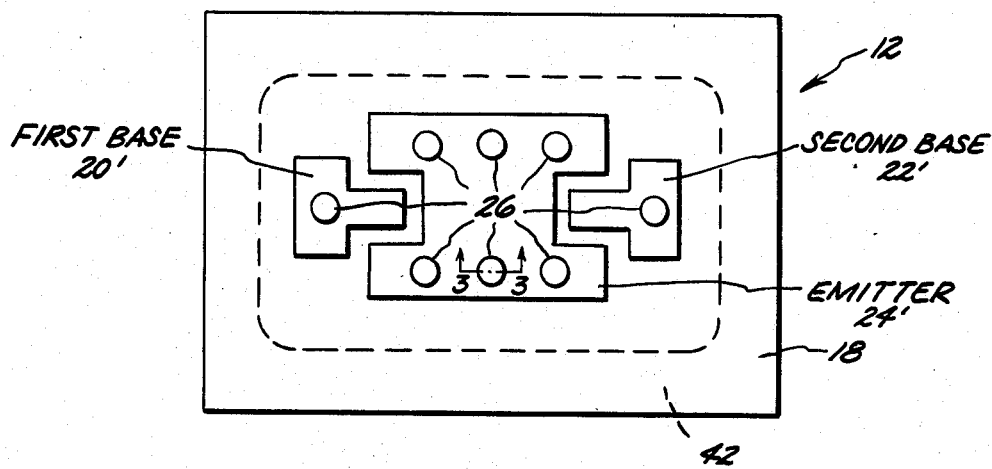
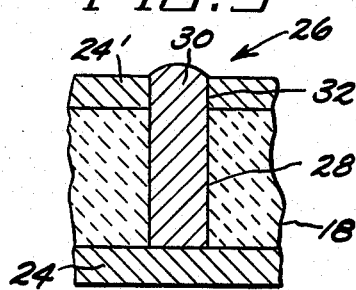
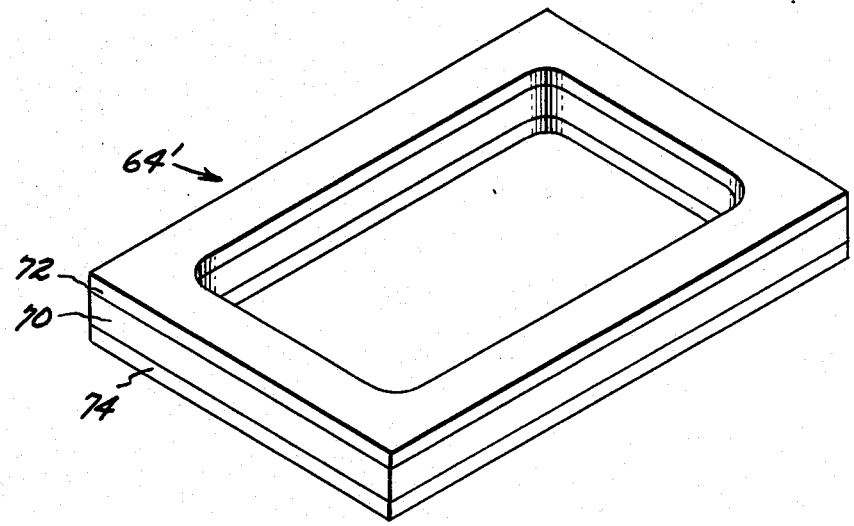

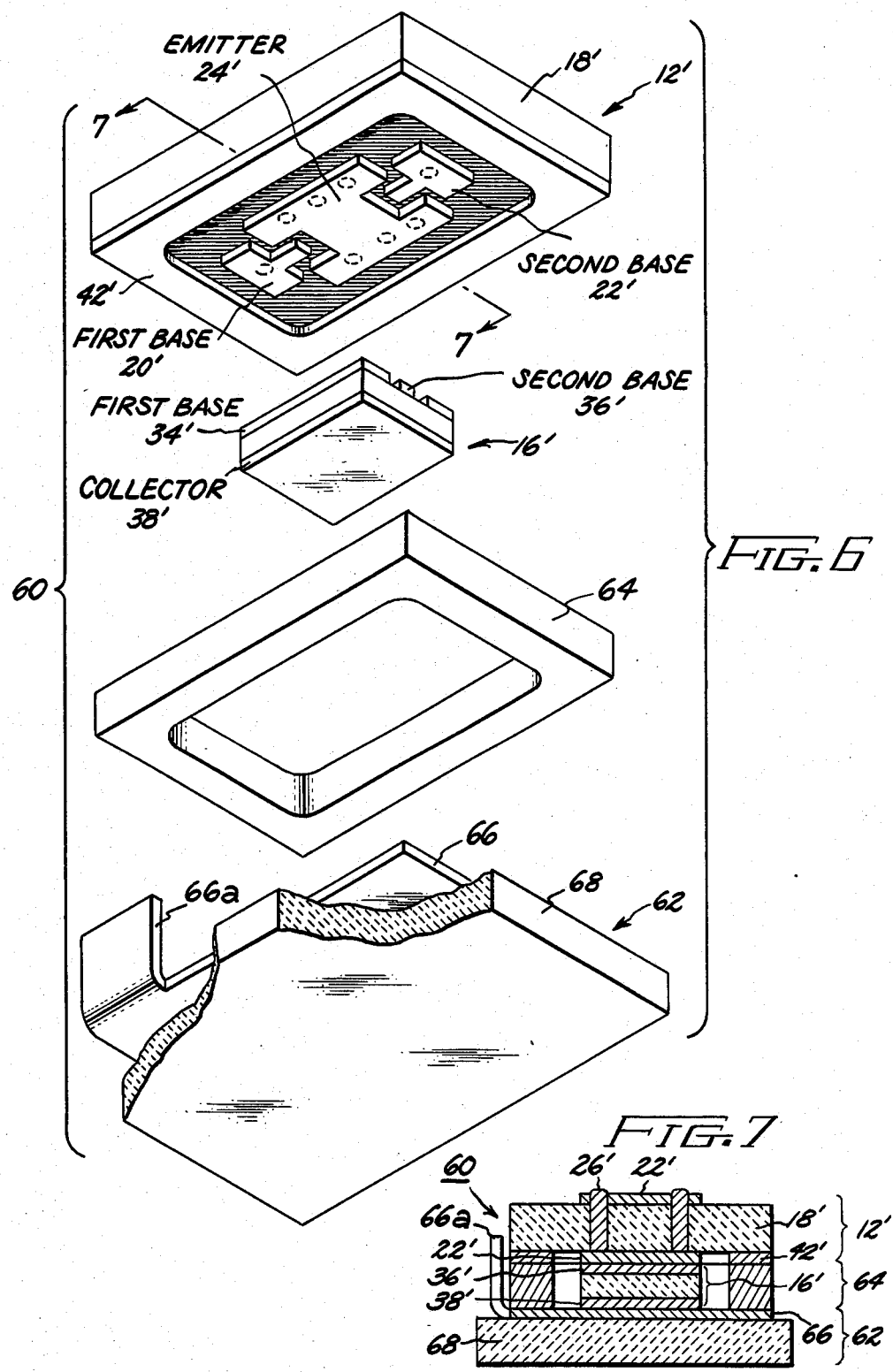

HERMETIC POWER CHIP PACKAGES

This application is a continuation of application Ser. No. 529,295, filed 9/6/83, abandoned.

BACKGROUND OF THE INVENTION

The present invention relates to packages for power semiconductor chips, and, more particularly, to hermetic power chip packages.

Power semiconductor chips (hereinafter, simply "power chips") generate waste heat during operation typically in excess of about one watt. This heat must be removed in order to prevent destruction of the power chip. Power chips are accordingly assembled in a package or arrangement designed to facilitate the removal of heat from the power chip. Hermetic, or airtight, packages are particularly desirable for packaging power chips, since hermetic packages shield the power chips from contaminants and moisture that are known to degrade the operating performance of power chips.

A typical hermetic power chip package that is presently available includes a relatively massive metallic baseplate on which the power chip is thermally mounted, and, which, in turn, is adapted to be thermally mounted upon a metallic heat sink. Two glass-to-metal hermetic seals are typically incorporated in the power chip package to permit electrical access to the power chip via current leads. These glass-to-metal seals are expensive to make, and the use of the metallic baseplate is also expensive. The power chip package additionally includes a housing that hermetically encloses the power chip and one or more of the foregoing glass-to-metal seals resulting in further expense of the package.

The foregoing describes a hermetic power chip package in an essentially completed form, that is, in a form ready for use in circuit applications. Initial electrical testing of power chips has heretofore been carried out by assembling the power chips in completed hermetic power chip packages to provide for removal of waste heat. Such testing is necessary to ascertain important device characteristics, such as, in a power Darlington transistor, the common emitter current gain, $H_{FE}$, and the collector-to-emitter voltage at device saturation, $V_{CE(SAT)}$. If the power chip in a power chip package does not meet the required standards, the entire power chip package is discarded. As a consequence, the testing of power chips in presently available hermetic packages is costly. In order to make testing of power chips more economical, it would be desirable to provide a hermetic power chip package in a partially-completed or building block form, so as to reduce the expense of discarded packages.

OBJECTS OF THE INVENTION

An object of the present invention is to provide a hermetic power chip package having a high capacity for heat removal from a power chip.

A further object of the invention is to provide a relatively inexpensive hermetic power chip package.

Another object of the invention is to provide a hermetic power chip package that is dielectrically isolated from a heat sink on which the hermetic power chip package may be mounted.

A still further object of the invention is to provide a hermetic power chip package in building block form.

A yet further object of the invention is to provide a hermetic power chip package that does not require the inclusion of a metallic baseplate for power chip testing.

SUMMARY OF THE INVENTION

These and other objects are carried out in a hermetic power chip package, which, in a preferred form as directed to a power Darlington transistor, includes an upper package section, a power Darlington transistor, and a lower package section. The upper package section comprises a dielectric plate with first and second base electrodes and an emitter electrode on the underside thereof. Electrical access to these electrodes is provided from the top side of the dielectric plate by corresponding first and second base leads and an emitter lead, which leads are respectively connected through the dielectric plate to the first and second base electrodes and the emitter electrode via vertically-oriented conducting-through holes in the dielectric plate. The upper package section further includes a metallic sealing ring bonded to the underside thereof and encompassing the first and second base electrodes and the emitter electrode.

The power Darlington transistor has first and second base terminals and an emitter terminal on the upper side thereof, which are electrically connected to the corresponding electrodes on the underside of the dielectric plate of the upper package section, and also has a collector terminal on the lower side thereof.

The lower package section comprises a collector electrode that is bonded to the single collector terminal and, additionally, that is bonded to the metallic sealing ring of the upper package section so as to hermetically enclose the power Darlington transistor.

The foregoing hermetic power chip package does not require a metallic baseplate and is in a partially completed or building block form.

A further hermetic power chip package in accordance with the present invention as directed to a power Darlington transistor, incorporates an upper package section and a power Darlington transistor that are suitably identical to the corresponding parts of the power chip package just described. The further package includes a lower package section comprising a collector electrode in sheet form bonded to the upper side of the plate, and which electrode, in turn, is bonded to the lower or collector terminal of the power Darlington transistor. A gasket is disposed between the upper and lower package sections, with the upper side of the gasket being bonded to the metallic sealing ring of the upper package section and the lower side of the gasket being bonded to the collector electrode of the lower package section. The thermal expansion coefficient of the gasket is preferably selected to be within about ±50 percent of that of the upper package section. The resulting package can undergo repeated cycling between widely differing hot and cold temperatures and yet maintain mechanical integrity and hermeticity.

BRIEF DESCRIPTION OF THE DRAWINGS

While the specification concludes with claims defining the features of the invention that are regarded as novel, it is believed that the invention, together with further objects thereof, will be better understood from considering the following description in conjunction with the drawing figures, in which:

FIG. 1 is an exploded view of a power chip package looking upward towards the power chip package, in accordance with the invention;

FIG. 2 is a top plan view of upper package section 12 of FIG. 1 shown somewhat enlarged;

FIG. 3 is a detail view in cross section of a conducting-through hole 26 of FIG. 2 taken along line 3—3 of FIG. 2;

FIG. 4 is a cross-sectional view of the power chip package of FIG. 1 when assembled, taken along line 4—4 in FIG. 1;

FIG. 5 is a view similar to FIG. 4, illustrating an alternative embodiment to the power chip package of FIG. 1;

FIG. 6 is an exploded view of a power chip package, looking upward towards the power chip package;

FIG. 7 is a cross-sectional view of the power chip package of FIG. 6 when assembled, taken along line 7—7 of FIG. 6; and FIG. 8 is a depiction of an alternative implementation of gasket 64 of FIG. 6.

DESCRIPTION OF THE PREFERRED EMBODIMENTS

There is shown as FIG. 1 an exploded view of a hermetic power chip package 10 looking upward towards package 10, in accordance with the present invention. Package 10 comprises upper and lower package sections 12 and 14 with an exemplary power chip 16 situated therebetween, such as a power Darlington transistor.

Upper package section 12 comprises a dielectric plate 18 with a thermal expansion coefficient close to that of power chip 16, for example the ceramic beryllia or alumina where power chip 16 comprises silicon. Bonded to the lower side of dielectric plate 18 are first base electrode 20, second base electrode 22 and emitter electrode, 24. These electrodes preferably comprise copper that has been bonded to dielectric plate 18 by a eutectic bonding procedure; that is, a bonding procedure during which a molten eutectic alloy is formed between each of electrodes 20, 22 and 24 and dielectric plate 18. Details of preferred eutectic bonding procedures are discussed (and claimed) in the following U.S. Patents: U.S. Pat. No. 3,766,634—G. L. Babcock et al., issued Oct. 23, 1973 and U.S. Pat. No. 3,994,430—D. A. Cusano et al., issued Nov. 30, 1976. These patents are assigned to the present assignee and their entire disclosures are incorporated herein by reference. As an alternative to using eutectically bonded copper for electrodes 20, 22 and 24, these electrodes may comprise metallic sheets, such as copper, that are soldered to a solderable metal layer (not shown) that is deposited onto the underside of dielectric plate 18, such as by evaporation of copper onto plate 18.

On the upper surface of dielectric plate 18, as shown in the enlarged top plan view of FIG. 2, a set of leads is provided that is complementary to electrodes 20, 22 and 24, that is, first base lead 20', second base lead 22' and emitter lead 24'. These complementary leads 20', 22' and 24' provide electrical access from the exterior of power chip package 10 to electrodes 20, 22 and 24, which are located in the interior of power chip package 10.

Electrically interconnecting interior electrodes 20, 22 and 24 (FIG. 1) with exterior electrodes 20', 22', and 24', as illustrated in FIG. 2, the conducting-through holes 26, indicated in FIG. 1 by dashed lines. A suitable construction of a conducting-through hole is illustrated in the detail view of FIG. 3, taken along lines 3—3 in FIG. 2, and which is in fragmentary, cross-sectional form. As can be observed in FIG. 3, a hole 28 is provided vertically through dielectric plate 18, which is filled with a conducting medium, such as solder 30. In a preferred procedure for forming conducting-through hole 26, hole 28 is first provided in dielectric plate 18, followed by the bonding of emitter electrode 24 to the underside of the dielectric plate 18. Electrode 24 covers the bottom of hole 28 so as to hermetically seal hole 28. Upper lead 24' is then bonded, as with a eutectic bonding procedure, to the upper side of dielectric plate 18, preferably with a preformed hole 32 being aligned with hole 28 of dielectric plate 18. Solder 30 is then melted into holes 28 and 32 so as to form a conductive link between emitter electrode 24 and emitter lead 24. Further details of suitable conducting-through holes are discussed, for example, in an article by J. F. Burgess, C. A. Neugebauer, G. Flanagan and R. W. Moore, entitled "Hybrid Packages by the Direct Bonded Copper Process", Solid State Technology, May 1975, pages 42-44 (see FIG. 5 and discussion thereof). This article is hereby incorporated by reference.

Referring again to FIG. 1, interior electrodes 20, 22 and 24 of upper package section 12 are patterned to correspond to the upper terminals of power chip 16, which, as illustrated in exaggerated form for a power Darlington transistor, comprise a first base terminal (not shown) corresponding to interior electrode 20 of upper package section 12, an emitter terminal 34, and a second base terminal 36.

Power chip 16 has a single collector terminal 38 on its lower side (at least for a Darlington transistor) and is adapted to electrically contact lower package section 14. In the illustrated embodiment of power chip package 10, lower package section 14 comprises a collector electrode 17, preferably formed from a metallic sheet, such as copper, with an exemplary upwardly projecting collector lead formed integrally with collector electrode 17 and, further, with an upwardfacing, concave recess 17b for accommodating power chip 16 when hermetic power chip package 10 is assembled. In order to permit bonding of lower package section 14 to upper package section 12, upper section 12 is provided with a metallic sealing ring 42, bonded to the underside thereof and encompassing interior electrodes 20, 22 and 24. Metallic sealing ring 42 preferably comprises copper eutectically bonded to dielectric plate 18, although it may comprise a solderable layer formed, for example, by evaporation of copper onto the underside of dielectric plate 18.

In accordance with a preferred procedure of assembling hermetic power chip package 10, the upper terminals of power chip 16 (i.e., the first base terminal, not shown, and terminals 34 and 36) are soldered to interior electrodes 20, 22 and 24 with preformed layers of solder. Lower terminal 38 of power chip 16 is then soldered to collector electrode 17 with a preformed layer of solder and, at the same time, collector electrode 17 may be soldered to metallic sealing ring 42 of upper package section 12. Other assembly procedures for package 10 will be apparent to those skilled in the art, such as a procedure wherein collector electrode 17 is bonded to metallic sealing ring 42 by laser or electron beam welding. When a sequence of soldering operations is used, as in the presently-described assembly procedure, a hierarchy of decreasing solder melting temperatures, preferably limited to two, will ensure that previous solder bonds are not remelted.

When power chip 10 is assembled, it appears as shown in the cross-sectional view of FIG. 4, which is taken along line 4—4 of FIG. 1. As can be observed, in FIG. 4, collector electrode 17 of lower package section 14 encloses power chip 16 within upwardly-facing concave recess 17b and is bonded to metallic sealing ring 42 of upper package section 12 so as to hermetically seal power chip 16 in package 10.

Power chip 16, when assembled in hermetic power chip package 10, can be electrically tested without danger of overheating and destruction, since collector electrode 17 can be mechanically pressed against a heat sink (not shown) for withdrawing heat from power chip 16. Electrical access to the first base terminal (not shown), second base terminal 36, and emitter terminal 34 of power chip 16 is provided via first base lead 20', second base lead 22', and emitter lead 24', respectively, on the surface of dielectric plate 18 (see FIG. 2). Hermetic power chip package 10 beneficially is in building block form inasmuch as it comprises only a portion of a complete hermetic power chip package assembly (not shown), and, as such, provides an economical means for testing power chip 16 before incorporation thereof into a complete, hermetic power chip package assembly. Of particular interest is the lack of a metallic baseplate in package 10.

If electrical isolation is desired between collector electrode 17 and a heat sink (not shown) upon which hermetic power chip package 10 is to be mounted, a further dielectric plate 44 as illustrated in FIG. 5 can be provided in bonded relationship to the underside of collector electrode 17 of power chip package 10. In the hermetic power chip package of FIG. 5, dielectric plate 44 preferably has a thermal expansion coefficient close to that of power chip 16 and suitably comprises the ceramic beryllia or alumina where power chip 16 comprises silicon. Dielectric plate 44 may be conveniently bonded to a metallic heat sink (not shown) via a metal layer 46 on the underside of dielectric plate 44, which preferably comprises copper eutectically bonded to dielectric plate 44, or alternatively, a solderable layer, such as evaporated copper. Collector electrode 17 is preferably bonded to dielectric plate 44 with a eutectic bonding procedure, although collector electrode 17 could alternatively be soldered to a solderable metal layer (not shown), such as evaporated copper, provided atop dielectric plate 44.

Turning now to FIG. 6, there is shown a hermetic power chip package 60 looking upward towards package 60, in accordance with a further embodiment of the invention. Package 60 comprises an upper package section 12' and a power chip 16', which are suitable identical to upper package section 12 and power chip 16, respectively, of power chip package 10 of FIG. 1. Like reference numerals as between FIG. 6 and FIG. 1 refer to like parts.

Hermetic power chip package 60 further includes a lower package section 62 and a gasket 64 situated between upper and lower package sections 12' and 62, respectively. Lower package section 62 comprises a collector electrode 66 with an exemplary collector lead 66a formed integrally therewith. If dielectric isolation of collector electrode 66 with respect to a metallic heat sink (not shown) is desired, lower package section 62 further includes a dielectric plate 68, such as the ceramic beryllia or alumina, with collector electrode 66 bonded to the upper surface of dielectric plate 68, preferably by a eutectic bonding procedure as discussed above. Gasket 64 preferably comprises a material having a thermal expansion coefficient within about ±50 percent of that of upper package section 12'. Where power chip 16 comprises silicon, for example, gasket 64 suitably comprises molybdenum or tungsten, by way of example.

The interfitting of the various portions of power chip package 60 can be best appreciated by considering FIG. 7, which is a cross-sectional view of package 60 taken along lines 7—7 of FIG. 6. As is shown, the upper side of gasket 64 is bonded to metallic sealing ring 42' of upper package section 12', and the lower side of gasket 64 is bonded to metallic sheet 66 of lower package section 62. Gasket 64 encompasses power chip 16'. It can be appreciated from FIG. 2 that dielectric plate 68 of lower package section 62 is wider and larger than collector electrode 66. This is to provide an elongated, so-called "electrical creep" distance on the surface of dielectric plate 68 between collector electrode 66 and a metallic baseplate (not shown) upon which dielectric plate 68 is typically mounted.

In accordance with a preferred procedure for assembling power chip package 60, power chip 16' is first soldered to interior electrodes 20', 22' and 24' of upper package section 12' with a preformed layer of solder. Gasket 64 is then soldered to sealing ring 42' of upper package section 12' with a preformed layer of solder and lower package section 62 is simultaneously soldered to both lower terminal 38' of power chip 16' and to the lower side of gasket 64 with preformed layers of solder. As will be apparent to those skilled in the art, the foregoing sequence of soldering operations can be carried out by using preformed layers of solder, to limit to two, with a hierarchy of decreasing melting temperatures, so as not to impair solder bonds once formed.

Hermetic power chip package 60 achieves a high degree of mechanical integrity and is thus suitable for use under repeated cycling of power chip 16' between widely differing heat and cold temperatures (e.g., between −40° C. and +150° C.) because gasket 64 expands and contracts horizontally with dielectric plate 12'.

In an alternative embodiment of hermetic power chip package 60, a gasket 64' as illustrated in FIG. 8 is provided in lieu of gasket 64 shown in FIG. 6. Gasket 64' comprises a dielectric material preferably having a thermal expansion coefficient within about ±50 percent of that of dielectric plate 18' (FIG. 7). Dielectric material 70 may suitably comprise the ceramic beryllia or alumina where power chip 16' comprises silicon, for example. Solderable metal layers 72 and 74 are bonded to the upper and lower surfaces of gasket 64', respectively, and preferably comprise eutectically bonded copper.

In providing a complete hermetic power chip package assembly (not illustrated), one or more of the foregoing, hermetic power chip packages may be mounted, as by soldering, to a metallic baseplate (not shown). Such metallic baseplate may advantageously have mounted thereon "signal", or non-power, chips in their customary packages, that is, in signal chip carriers, resulting in a hybrid package. An inexpensive, non-hermetic housing may then be provided covering the metallic baseplate and both a hermetic power chip package(s) and a signal chip carrier(s), with provision for external electrical leads connected to the electrical leads of the enclosed hermetic power chip package(s) or signal chip carriers.

The foregoing describes hermetic power chip packages in building block form that permit economical testing of power chips and have a high capacity for waste heat removal from the power chips. In one embodiment, dielectric isolation is provided between a hermetic power chip package and a metallic heat sink on which the package is typically mounted.

While the invention has been described with respect to specific embodiments, many modifications and substitutions thereof will be apparent to those skilled in the art. It is, therefore, to be understood that the following claims are intended to cover all such modifications and substitutions as fall within the true spirit and scope of the invention.

What is claimed is:

1. A hermetic power chip package, comprising:
an upper package section comprising a dielectric plate, at least a first electrode bonded to a lower surface of said plate and a first metallic lead bonded to an upper surface of said plate, at least one conducting-through hole in said dielectric plate electrically interconnecting said first electrode and said first metallic lead, and a metallic sealing ring bonded to the lower side of said plate and encompassing said first electrode;
said first electrode bonded to said dielectric plate so as to hermetically seal said conducting-through hole;
a power chip including at least a first terminal located on an upper side thereof and bonded to said first electrode of said upper package section and further including a single terminal on a lower side thereof; and
a package lower section comprising a power chip lower electrode in sheet form bonded to said single terminal on the lower side of said power chip, said power chip lower electrode also being bonded to said metallic sealing ring of said upper package section so as to hermetically enclose said power chip.

2. The hermetic power chip package of claim 1 wherein said first electrode and said first metallic lead each comprises copper that is eutectically bonded to said dielectric plate.

3. The hermetic power chip package of claim 2 wherein said metallic sealing ring of said package upper section comprises copper that is eutectically bonded to said dielectric plate.

4. The hermetic power chip package of claim 1 wherein said package lower section further comprises a dielectric plate bonded to the underside of said power chip lower electrode and a metallic sheet bonded to the underside of said dielectric plate.

5. A hermetic power chip package, comprising:
an upper package section comprising a dielectric plate, at least a first electrode bonded to a lower surface of said plate and a first metallic lead bonded to an upper surface of said plate, at least one conducting-through hold in said dielectric plate electrically interconnecting said first electrode and said first metallic lead, and a metallic sealing ring bonded to the lower side of said plate and encompassing said first electrode;
said first electrode bonded to said dielectric plate so as to hermetically seal said conducting-through hole;
a power chip having at least a first terminal located on an upper side thereof and bonded to said first electrode of said upper package section and having a single terminal on a lower side thereof; and
a package lower section comprising a power chip lower electrode in sheet form bonded to said single terminal on the lower side of said power chip; and
a gasket with upper and lower sides and encompassing said power chip, said upper side being bonded to said metallic sealing ring of said package upper section and said lower side being bonded to said power chip lower electrode of said package lower section so as to hermetically enclose said power chip.

6. The hermetic power chip package of claim 5 wherein said gasket has a thermal expansion coefficient within about ±50 percent of that of said dielectric plate of said upper package section.

7. The power chip package of claim 5 wherein said power chip comprises silicon and said gasket comprises one of the group consisting of tungsten and molybdenum.

8. The power chip package of claim 5 wherein said gasket comprises a ceramic with upper and lower layers of copper being eutectically bonded to upper and lower surfaces of said gasket, respectively.

9. The power chip package of claim 5 wherein said first electrode and said first metallic lead each comprises copper that is eutectically bonded to said dielectric plate of said upper package section.

10. The hermetic power chip package of claim 9 wherein said metallic sealing ring of said package upper section comprises copper that is eutectically bonded to said dielectric plate of said package upper section.

11. The hermetic power chip package of claim 5 wherein said package lower section further comprises a dielectric plate bonded to the underside of said power chip lower electrode and a metallic sheet bonded to the underside of said dielectric plate.

* * * * *